United States Patent
Yu et al.

(10) Patent No.: US 7,979,775 B2
(45) Date of Patent: Jul. 12, 2011

(54) TURBO INTERFERENCE SUPPRESSION IN COMMUNICATION SYSTEMS

(75) Inventors: Xiaoyong Yu, Grayslake, IL (US); Michael N. Kloos, Belvidere, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 1258 days.

(21) Appl. No.: 11/554,209

(22) Filed: Oct. 30, 2006

(65) Prior Publication Data
US 2008/0109701 A1   May 8, 2008

(51) Int. Cl.
*H03M 13/00* (2006.01)
(52) U.S. Cl. ......... 714/755; 714/760; 714/786; 375/261
(58) Field of Classification Search .................. 714/755, 714/786, 760; 375/261
See application file for complete search history.

(56) References Cited

U.S. PATENT DOCUMENTS

| | | | |
|---|---|---|---|
| 7,590,186 B2 * | 9/2009 | Yu et al. | 375/261 |
| 2004/0261000 A1 | 12/2004 | Hewitt et al. | |
| 2005/0220203 A1 | 10/2005 | Ojard | |

OTHER PUBLICATIONS

Litva, John and Lo, Titus Kwok-Yeung: Digital Beamforming in Wireless Communications, Artech House, 1996, pp. 13-55.
Liberti,Jr., Joseph C. and Rappaport, Theodore S.: Smart Antennas for Wireless Communications, IS-95 and Third Generation CDMA Applications, Prentice Hall PTR, Upper Saddle River, NJ 07458, http://www.phptr.com, 1999, pp. 81-102.

* cited by examiner

*Primary Examiner* — Guy J Lamarre

(57) ABSTRACT

Disclosed is a method and communication device for suppressing interference. The method comprises performing, with a turbo decoder (314), at least one turbo decoding attempt (1106) on a received signal (1104). The turbo decoding attempt generates at least one whole word code bit therefrom (1108). The whole word code bit (1108) corresponds to a group of bits comprising a transmitted symbol. The method determines if the whole word code bit (1108) has a confidence level exceeding a given threshold (1110). If the whole word code bit (1108) does have a confidence level exceeding the given threshold, the whole code word bit is selected for use in data symbol recovery (1114).

20 Claims, 9 Drawing Sheets

— PRIOR ART —

TURBO INTERFERENCE SUPPRESSION IN COMMUNICATION SYSTEMS

FIELD OF THE INVENTION

The present invention generally relates to the field of communication systems, and more particularly relates to interference suppression communication systems using high order modulation.

BACKGROUND OF THE INVENTION

In IEEE 802.16e Uplink Partially Used Subchannelization ("PUSC") mode, the minimal signal unit for receiver processing is a tile. A tile comprises four consecutive tones in the frequency domain and three consecutive Orthogonal Frequency Division Multiple Access ("OFDMA") symbols. Six tiles chosen according to a pseudo random hopping sequence comprise a subchannel. A collection of subchannels used to transmit to a particular user is called an allocation. The OFDMA tiles hop around in the frequency-time grid to facilitate tone-hopping for interference mitigation. This hopping pattern is unique for each cell. Space Division Multiple Access ("SDMA") is used in some wireless communication systems for optimizing the radio spectrum. For example, SDMA allows for channel separation to be obtained with users occupying the same time/frequency resources.

In a wireless communication system without SMDA, the tile hopping pattern is sector or cell dependent. Therefore, the interference seen is "average out". However, in systems utilizing SDMA, two or more users occupying the same time/frequency resources are "supposed" to be separated by antenna array technology such as beam-forming, beam-steering, spatial interference cancellation, and the like. The four pilot symbols existing in a tile are simply binary-phase key shifting ("BPSK") symbols. Therefore, there are only a total of 16 possible different pilot sequences.

If both users either have the same pilot sequence or the inverse sequence in a tile, one user can completely interfere with the other user for that tile. In other words, in the case of two users sharing one tile in a sector, the chance that the shared tile will be interfered with is ⅛. This can potentially limit the SDMA application. A similar problem exists in Adaptive Modulation Coding ("AMC") mode, though not to as great an extent, where the chance that one bin (the minimum signal unit for receiver processing) is completely interfered with is 1/32.

One digital transmission technique used in IEEE 802.16e systems is Orthogonal Frequency Division Multiplexing (OFDM). OFDM is a digital transmission technique in which a signal is split into several narrowband subchannels at different frequencies. When modulating and demodulating signals, OFDM minimizes the inter-subchannel interference and inter-symbol interference among the subchannels and symbols of the data stream. To obtain robust performance in poor signal conditions, Forward Error Correction (FEC) typically is used in conjunction with OFDM. In telecommunications, for example, FEC refers to a system of error control for data transmission where the receiving device has the capability to detect and correct fewer than a predetermined number or fraction of bits or symbols corrupted by transmission errors. FEC is implemented by adding redundancy to the transmitted information using some sort of coding or algorithm.

One type of OFDM receiver that employs FEC incorporates Low-Density Parity-Check ("LDCP") codes. FIG. 1 is a block diagram that depicts a conventional OFDM communication system 100 utilizing LDPC as a means of FEC. An LDPC code is an error correcting code that provides a more reliable method of transmitting a message over a noisy transmission channel. LDPC uses a sparse parity-check matrix that is randomly generated and subject to sparsity constraints.

The system 100 can include a transmitter 102 which sends wireless signals via a channel 104 to a receiver 106. The transmitter 102 includes an LDPC encoder 108 which encodes bits of information. The encoded information bits are interleaved and mapped to Quadrature Amplitude Modulation ("QAM") symbols in module 110. As known, interleaving generally scrambles the sequential order of the data stream according to a known pattern. The data stream can be interleaved with respect to time, frequency, or both time and frequency.

The resulting QAM symbols generated in module 110 are processed using an Inverse Fast Fourier Transform ("IFFT") in module 112 to generate an OFDM symbol. Module 112 further adds a cyclic prefix to each OFDM symbol. The resulting signal can be transmitted via channel 104, i.e., as a wireless signal.

The receiver 106 includes a timing module 114 which selects samples to be processed using a Fast Fourier Transform ("FFT") in module 116. The resulting signal is demodulated in demodulator 118. Functions including, but not limited to, channel estimation, equalization, automatic frequency control ("AFC"), and bit-log-likelihood ratio (LLR) generation also can be performed in demodulator 118. The bit-LLRs are de-interleaved, or descrambled, in de-interleave module 120. The de-interleave module 120 effectively reverses the interleaving process performed by module 110 to recover the proper data order. The resulting signal is provided to the LDPC decoder 122 where information bits are recovered.

One of the problems with the system 100 discussed above is that it only uses pilot symbols for separating the desired and interfering signals. If pilot symbols on a particular tile happen to coincide with either the pilot sequence or the inverse pilot sequence of an interfering signal, the interfering signal cannot be separated from the desired signal. This will degrade the performance of the whole receiver.

Therefore a need exists to overcome the problems with the prior art as discussed above.

SUMMARY OF THE INVENTION

Briefly, in accordance with the present invention, disclosed is a method and communication device for suppressing interference. The method comprises performing, with a turbo decoder, at least one turbo decoding attempt on a received signal. The turbo decoding attempt generates at least one whole word code bit therefrom. The whole word code bit corresponds to a group of bits comprising a transmitted symbol. The method determines if the whole word code bit has a confidence level exceeding a given threshold. If the whole word code bit has a confidence level exceeding the given threshold, the whole code word bit is selected for use in data symbol recovery.

In another embodiment, a communication device for suppressing interference is disclosed. The communication device includes a memory and a processor communicatively coupled to the memory. The communication device also includes an OFDM receiver that is communicatively coupled to the processor and memory. A turbo decoder is communicatively coupled to the OFDM receiver. The turbo decoder performs at least one turbo decoding attempt on a received signal so as to generate at least one whole word code bit therefrom. The whole word code bit corresponds to a group of bits comprising a transmitted symbol. The turbo decoder determines if the whole word code bit has a confidence level exceeding a given threshold. In response to the whole word code bit having a confidence level exceeding the given threshold, the turbo decoder selects the whole code word bit for use in data symbol recovery.

One of the advantages of the present invention is that recovered data symbols are used as pilots to iteratively reduce the chance of interference between multiple users. Stated differently, the present invention reduces the chance that multiple users cannot be separated by conventional antenna technology, thereby causing interference between the users. Another advantage of the present invention is that error propagation is limited by generating all code bits directly from a modified turbo decoder as compared to re-encoding. Error propagation is further limited by obtaining a "confidence" measure of decoded bits to be used in cancelling interference, and not using a particular bit to cancel interference unless it exceeds a threshold. Further, not only data bits are used, but parity bits from a modified turbo decoder are used to provide further interference cancelling benefit.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The term wireless communication device is intended to broadly cover many different types of devices that can wirelessly receive signals, and optionally can wirelessly transmit signals, and may also operate in a wireless communication system. For example, and not for any limitation, a wireless communication device can include any one or a combination of the following: a cellular telephone, a mobile phone, a smartphone, a two-way radio, a two-way pager, a wireless messaging device, a laptop/computer, automotive gateway, residential gateway, and the like.

Wireless Communications System

Figure 1:
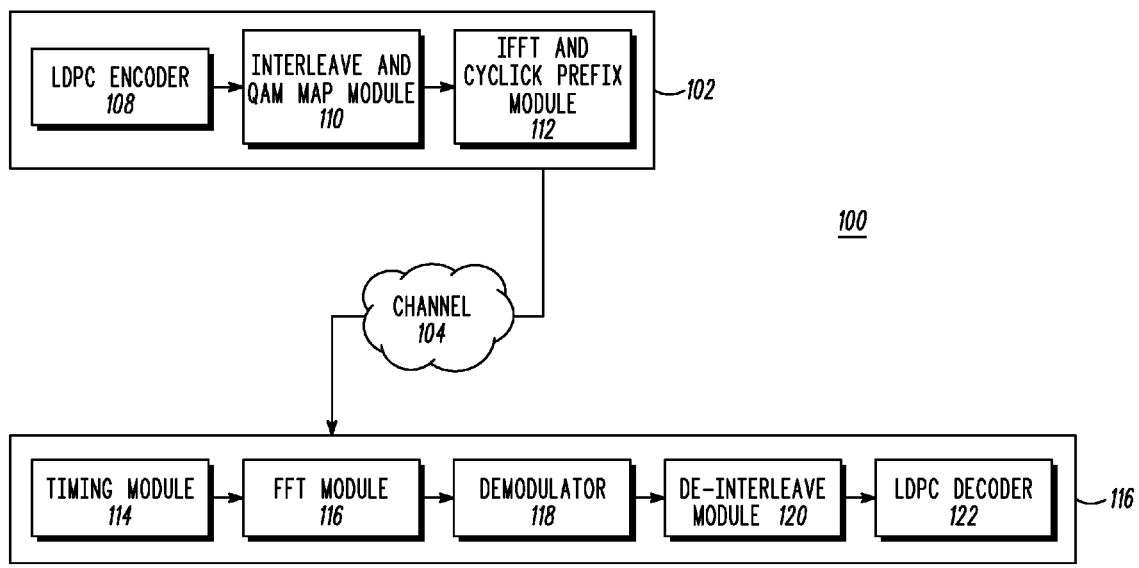
FIG. 1 is block diagram illustrating a prior art Orthogonal Frequency Division Multiplexing communication system.
Figure 2:
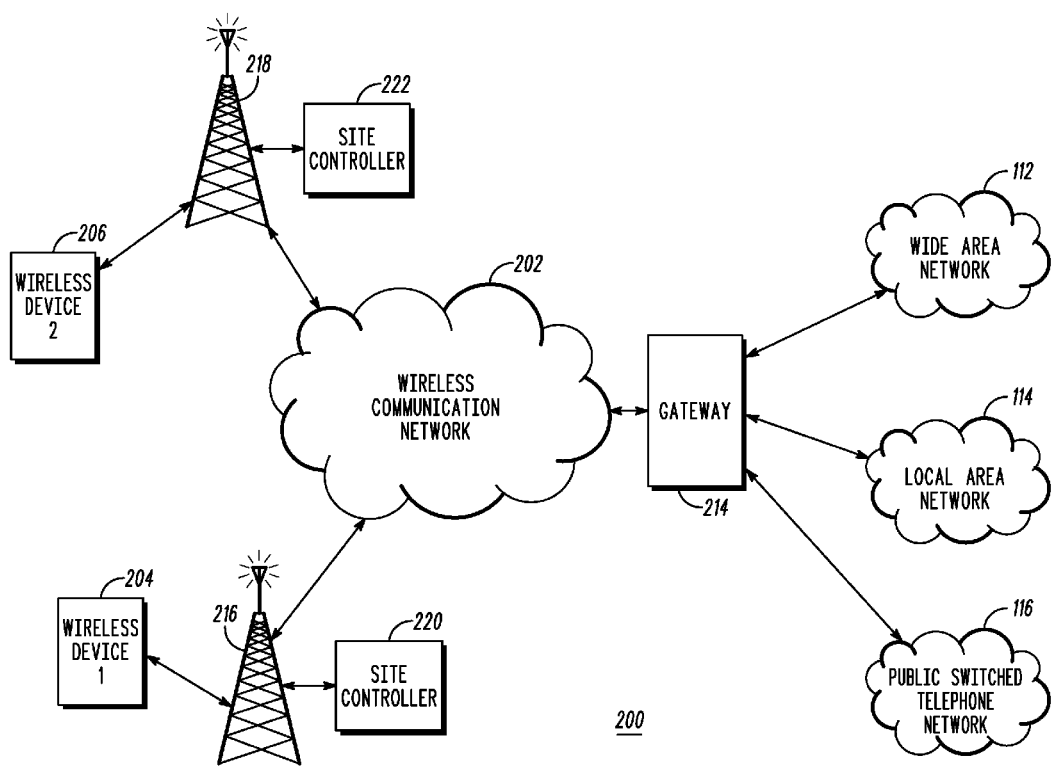
FIG. 2 is a block diagram illustrating a wireless communication system according to an embodiment of the present invention.

According to an embodiment of the present invention, as shown in FIG. 2, a wireless communications system 200 is illustrated. FIG. 2 shows a wireless communications network 202 that connects wireless communication devices 204, 206 to other wireless communication devices and/or to other networks such as a wide area network 208, a local area network 210, a public switched telephone network 212, and the like via a gateway 214. The wireless communications network 202 comprises a mobile phone network, a mobile text messaging device network, a pager network, or the like.

Further, the communications standard of the wireless communications network 202 of FIG. 2 comprises Code Division Multiple Access (CDMA), Time Division Multiple Access (TDMA), Global System for Mobile Communications (GSM), General Packet Radio Service (GPRS), Frequency Division Multiple Access (FDMA), Orthogonal Frequency Division Multiplexing (OFDM), or the like. Additionally, the wireless communications network 202 also comprises text messaging standards, for example, Short Message Service (SMS), Enhanced Messaging Service (EMS), Multimedia Messaging Service (MMS), or the like. The wireless communications network 202 also allows for push-to-talk over cellular communications between capable wireless communication devices.

The wireless communications network 202 supports any number of wireless communication devices 204, 206. The support of the wireless communications network 202 includes support for mobile telephones, smart phones, text messaging devices, handheld computers, pagers, beepers, wireless communication cards, or the like. A smart phone is a combination of 1) a pocket PC, handheld PC, palm top PC, or Personal Digital Assistant (PDA), and 2) a mobile telephone. More generally, a smartphone can be a mobile telephone that has additional application processing capabilities. In one embodiment, wireless communication cards (not shown) reside within an information processing system (not shown). The information processing system (not shown), in one embodiment, can be a personal computer, a personal, digital assistant, a smart phone, and the like.

The wireless communications system 200 also includes a group of base stations 216, 218 comprising a site controller 220, 222. In one embodiment, the wireless communications network 202 is capable of broadband wireless communications utilizing time division duplexing ("TDD") as set forth, for example, by the IEEE 802.16e standard. The duplexing scheme TDD allows for the transmissions of signals in a downstream and upstream direction using a single frequency. It should be noted that the present invention is not limited to an 802.16e system for implementing TDD. Other communication systems that this invention may be applied to include UMTS LTE, 802.20 systems, and the like. Furthermore, the wireless communications system 200 is not limited to a system using only a TDD scheme. For example, TDD may be only used for a portion of the available communication channels in the system 200, while one or more schemes are used for the remaining communication channels.

Turbo Decoding

As discussed above, current methods for SDMA or interference suppression in IEEE 802.16e system only use pilot symbols. If pilot symbols on a particular tile happen to coincide with either the pilot sequence or the inverse pilot sequence of an interfering signal, the interfering signal cannot be separated from the desired signal. This will degrade the performance of the whole receiver. For simplicity and without loss of generality, minimum-mean square error interference suppression ("MMSE") interference suppression is discussed as one only example for the present invention. However, the present invention can be easily extended to other technologies.

As discussed above, current receivers utilize conventional antenna array for SDMA or interference suppression in IEEE 802.16e systems. The goal of interference suppression is to find N antenna weights to apply to each antenna branch after FFT and then pass the combined signal to the channel decoder. As an example, two users are assumed to share the same tile hopping pattern in a sector with SDMA. For MMSE, the combining weights for user 1 are found as the solution to:

$$W(k,b) = \text{argmin}\{E|W^H(k,b)Y(k,b) - X_1(k,b)|^2\}$$

Where k and b are used for tone index and OFDMA symbol index respectively; W(k, b) is an N-by-1 vector for tone k of OFDMA symbol b; $X_1$(k, b) is the pilot symbol for user 1 that is the desired user currently; Y(k, b) is an N-by-1 vector that represents received signals from the N antennas respectively. In the case of normalized data and pilot, i.e., $E|X_u(k, b)|^2=1$ for all users, the solution for W(k, b) can be shown to be $$W(k,b) = H(k,b)\{R(k,b)\}_1$$

Where $\{A\}_n$ means the nth column of the matrix A and H(k, b) is N-by-2 matrix consist of channel estimate of each antenna branch of each user for tone k and OFDMA symbol b, that is $$H(k,b) = [H_1(k,b) H_2(k,b)] \text{ and } R(k,b) = (H^H(k,b)H(k,b) + \sigma^2 I_{2\times 2})^{-1}$$

Here, $H_1$(k, b) and $H_2$(k, b) are channel estimates of user 1 and user 2 for N antenna branches and $\sigma^2$ is AWGN variance of each antenna branch. The weights for user 2 can be similarly calculated by using the second column of the matrix R(k, b). Since $H_1$(k, b) and $H_2$(k, b) are determined by using the pilot symbols of user 1 and user 2 based on each antenna branch signal respectively, a tile can not be decomposed for user 1 and user 2 if both users have the same pilot sequence, or if one pilot sequence is negative of the other sequence in that tile.

It can be seen that there is potentially a different MMSE combining weight for each tone and OFDMA symbol in a tile per user. That implies an intensive computation for interference suppression in SDMA. For trade-off between complexity and performance, the MMSE weights can be determined the same for all tones or all OFDMA symbols in a tile or even only one weight per tile.

One of the advantages of the present invention is that recovered data symbols are used as pilots to iteratively reduce the interference between multiple users. Stated differently, the present invention reduces the chance that multiple users cannot be separated by conventional antenna technology, thereby causing interference between the users. Another advantage of the present invention is that error propagation is limited by generating all code bits directly from a modified turbo decoder as compared to re-encoding.

For example, conventional methods pass decoded information bits through the same channel encoder as that in the transmitter to rebuild all code bits that are required for data symbol recovery. This is referred to as a re-encoding technique. This may be acceptable for convolutional codes, but turbo codes need more consideration. Because the constituent code of a turbo code, such as CTC in 802.16e, is a recursive convolutional code that has infinite impulse response associated with the encoder, any single error in decoded information bit may cause multiple errors in re-encoded bit sequence, which in turn, causes multiple errors in data symbols. Because of this error propagation effect, the present invention provides a turbo decoder 314 (FIG. 3) such that all code bits are generated directly from the decoder 314 to avoid re-encoding, while keeping the extra computation negligible.

A practical turbo decoding consists of trellis searches that minimizes the probability of error for an information bit given the received sequence, and it also provides the probability that the information bit is either 1 or −1 (corresponds to binary bit 0 and 1) given the received sequence. During the decoding procedure, the log-likelihood ratio (LLR) for each information bit is calculated as $$L(b_k) = \ln \frac{\sum_{(m,n) \in B^1} \alpha_{k-1}(n) \gamma_k(n, m) \beta_k(m)}{\sum_{(m,n) \in B^{-1}} \alpha_{k-1}(n) \gamma_k(n, m) \beta_k(m)}$$

where $\gamma_k$(n,m), called branch metric in the encoding trellis, represents the transition probability from state n at time k−1 to state m at time k, given the current received samples $u_k$, here $u_k$ denotes a pair of received soft bits associated with information bit k; $\alpha_{k-1}$(m) is the probability of being in state m at time k−1 with the received sequence $\{u_1, u_2, \ldots, u_{k-1}\}$, and $\beta_k$(m) denotes the probability of generating the received sequence $\{u_{k-1}, \ldots, u_Q\}$ from state m at time k. Here Q denotes the size of code block. The probability $\alpha_k$(m) can be expressed as function of $\alpha_{k-1}$(n) and $\gamma_k$(n,m) and is calculated by a forward recursion $$\alpha_k(m) = \sum_{n=0}^{M-1} \alpha_{k-1}(n) \gamma_k(n, m) \quad m = 0, \ldots, M - 1$$

where M is the number of states associated with the constituent code. The reverse or backward recursion for computing the probability $\beta_k$(n) from $\beta_{k+1}$(m) and $\gamma_k$(n,m) is $$\beta_k(n) = \sum_{m=0}^{M-1} \beta_{k+1}(m) \gamma_k(n, m) \quad n = 0, \ldots, M - 1$$

The numerator of LLR of bit k $b_k$ is computed by summing over the set $B^1$ which denotes that all transitions correspond to $b_k$=1. Similarly, the denominator of LLR of $b_k$ is calculated over the set $B^{-1}$ where all transitions give $b_k$ equals −1. According to the MAP criterion, the LLR of kth parity bit $p_k$ given the received samples $u=\{u_1, \ldots, u_Q\}$ can be written as $$L(p_k) = \ln\frac{p(p_k = 1 \mid u)}{p(p_k = -1 \mid u)} = \ln\frac{p(p_k = 1 \mid u)}{p(p_k = -1 \mid u)}$$

where p(.) denotes probability, and the hard decision is obtained based on the sign of LLR. It can be shown that the LLR of the kth parity bit $p_k$ can be expressed as $$L(p_k) = \ln\frac{\sum_{(m,n)\in P^1} \alpha_{k-1}(n)\gamma_k(n,m)\beta_k(m)}{\sum_{(m,n)\in P^{-1}} \alpha_{k-1}(n)\gamma_k(n,m)\beta_k(m)}$$

Where $P^1$ and $P^{-1}$ have a similar meaning of $B^1$ and $B^{-1}$ respectively. In turbo decoding, the major computation and memory are utilized for determining $\gamma_k(n,m)$, $\alpha_k(m)$ and $\beta_k(n)$. Once they are available for information bits, a very small amount of extra computation is needed to calculate the LLR of parity bits. Furthermore, there is no extra delay introduced (this is another advantage compared with re-encoding). While the numerator for $L(b_k)$ is summed (in practice it means max* operation which is defined as max*(a, b)=max(a, b)+ln[1+exp(−|a−b|)]) over state transitions given by (0,0), (1,4), (2,5), (3,1), (4,2), (5,6), (6,7) and (7,3), the numerator for $L(p_k)$ is determined by state transitions (0,0), (1,4), (2,1), (3,5), (4,6), (5,2), (6,7) and (7,3). As can be seen they differ in 4 transitions. In other words, only 4 new max* operations need to be performed.

Receiver

Figure 3:
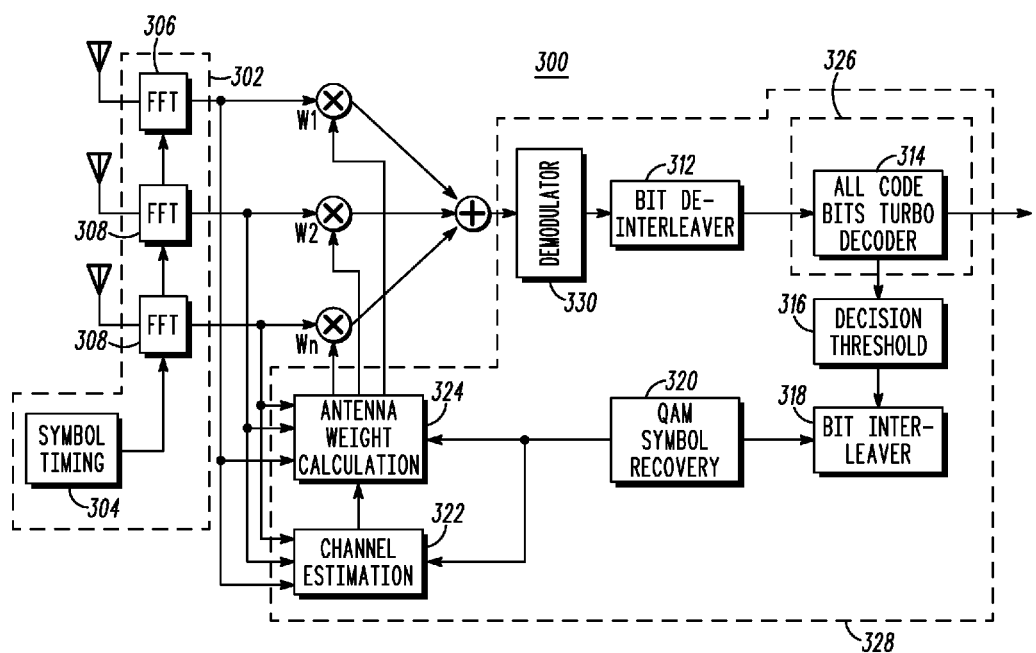
FIG. 3 is a block diagram illustrating an Orthogonal Frequency Division Multiplexing receiver architecture according to an embodiment of the present invention.

FIG. 3 is a block diagram that depicts an OFDM receiver 300 including a novel all code bits turbo decoder 314 according to one embodiment of the present invention. The receiver 300, in one embodiment, can reside within a wireless communication device 204, 206 or a base station/site controller. The receiver 300, in one embodiment, includes a pre-processing module 302, which includes a symbol timing module 304 and one or more Fast Fourier Transform ("FFT") modules 306, 308, 310. The receiver 300, in one embodiment, also can include a demodulator 330, a bit de-interleave module 312, an all code bits turbo decoder 314, a decision threshold module 316, a bit interleave module 318, a Quadrature Amplitude Modulation ("QAM") symbol recovery module 320, a channel estimator module 322, and an antenna weight calculation module 324. Each of these components, in one embodiment, is communicatively coupled to one another. It should be appreciated that the various components and/or subsystems of the receiver 300 can be implemented using computer programs executing within suitable digital signal processors, one or more discreet components, one or more programmable logic devices, or any combination thereof.

The receiver 300, in one embodiment, comprises at least two nested loops. A first loop 326, called the turbo decoding loop, can refer to the iterative turbo decoding process as implemented by the turbo decoder 314. A second loop 328, referred to as the joint demodulation-decoding loop, can be characterized by a forward processing stage that includes the demodulator 330, the bit de-interleave module 312, the turbo decoder 314, and a feedback processing stage that includes the decision threshold module 316, the bit interleave module 318, the QAM symbol recovery module 320, channel estimation module 322, and the antenna weight calculation module 324. The bit interleave module 318, in one embodiment, receives signals from the turbo decoder 314 and the QAM symbol recovery module 320 can direct signals to the channel estimation module 322 and the antenna weight calculation module 324. If a particular data or parity bit's LLR exceeds the threshold, it is used to degenerate the data constellation, which means narrowing down the possible choices of what constellation symbol is sent.

Once some constellation symbol choices are eliminated due to information from decoded data or parity bits that have high confidence, the constellation point of the remaining possible points which is closest to the soft received symbol is chosen. This decoded constellation point as well as the soft received symbol is sent to the channel estimator module 322, and the antenna weight calculation module 324. The recovered data and parity symbols along with pilot symbols produce channel estimates at their respective symbol locations, and these channel estimates form an augmented matrix of channel estimates H(k, b). H(k, b) is a N-by-2 matrix consisting of channel estimate of each antenna branch of each user for tone k and OFDMA symbol b. The solution for the weight matrix W(k, b), as calculated by module 324, can be shown to be $$W(k,b) = H(k,b)\{R(k,b)\}_1$$

Where $\{A\}_n$ means the nth column of the matrix A and H(k, b) is N-by-2 matrix consist of channel estimate of each antenna branch of each user for tone k and OFDMA symbol b, that is $$H(k,b) = [H_1(k,b) H_2(k,b)] \text{ and } R(k,b) = (H^H(k,b)H(k,b) + \sigma^2 I_{2\times 2})^{-1}$$

Here, $H_1(k, b)$ and $H_2(k, b)$ are channel estimates of user 1 and user 2 for N antenna branches and $\sigma^2$ is AWGN variance of each antenna branch. Since $H_1(k, b)$ and $H_2(k, b)$ are determined by using the pilot symbols of user 1 and user 2 based on each antenna branch signal respectively, a tile could not originally be decomposed for user 1 and user 2 if both users have the same pilot sequence, or if one pilot sequence is negative of the other sequence in that tile. However, in this iteration, both the pilot symbols and the recovered data and parity bits which have high confidence are used to augment $H_1(k, b)$ and $H_2(k, b)$ so that they may now be separated.

The timing module 304, in one embodiment, can select samples which are processed using an FFT in one or more of the FFT modules 306, 308, 310. The demodulator 330, in one embodiment, can demodulate the received signal. As noted, the demodulator 330 also can be configured to perform functions including, but not limited to, channel estimation, equalization, and automatic frequency control (AFC). The decoded signal, which is formed of soft symbols, can be provided to the de-interleave module 312. The de-interleave module 312 can descramble, or effectively apply the reverse of the interleave process originally applied in the transmitter. The de-interleaved signal then can be provided to the turbo decoder 314, which can attempt to recover information bits from the de-interleaved data stream. In operation, the first pass through receiver 200, as described above, can be performed substantially the same as in a conventional OFDM receiver.

While successful turbo decoding does not guarantee that the decoded code block is error free, such a condition indicates that the error probability is low. The probability of error is an inverse exponential function of code block length for a well-designed turbo code. In any case, this variety of error can be detected by a Cyclic Redundancy Check ("CRC"), which can be implemented as a type of hash function that produces a checksum against a larger block of data, i.e., a packet of network traffic or a block of a computer file. The error can be handled using an up-layer involved Automatic Repeat-re-Quest ("ARQ") function. An ARQ function refers to an error control technique for data transmission in which the receiver detects transmission errors in a message and automatically requests a retransmission from the transmitter.

The process of decoding within the receiver 300 can continue until such time that a predetermined number of turbo decoding iterations is performed. If the predetermined number of turbo decoding iterations is reached, the second loop 328 can be engaged.

When the second loop 328 is engaged, LLR metrics of data and parity bits can be provided as feedback from the turbo decoder 214 to the decision threshold module 316. The decision threshold 316 module can then transmit its signal to the bit interleave module 318. The bit-interleave module 318, in one embodiment, interleaves bits by performing an inverse of the de-interleave function performed by bit de-Interleave module 312. The resulting interleaved bits are then provided to the QAM symbol recovery module 320. The QAM symbol recovery module 320, in one embodiment produces hard decisions of QAM symbols associated with received code words.

The recovered QAM symbols, in conjunction with associated reference symbols, in one embodiment, are provided to the channel estimation module 322 and the antenna weight calculation module 324. Reference symbols, as used herein, refer to pilot symbols that are embedded in data traffic. Pilot symbols traditionally are used for channel estimation. With respect to the arrangements disclosed herein, pilot symbols can be used for channel estimation and antenna weight generation during the first processing pass. Subsequently, both the pilot symbols and recovered QAM data symbols can be used for channel estimation and antenna weight generation.

The joint demodulation-decoding loop 328 can be repeated a predetermined number of times. More particularly, the joint demodulation-decoding loop 328 can be performed once for each time a predetermined number of turbo decoding iterations are run. The loop 328 can be exercised as discussed until a predetermined number of iterations of the loop 328 are performed. The architecture illustrated with reference to FIG. 3 can provide a total number of turbo decoding iterations for a particular code word of $N_{turbo} \times (N_{joint}+1)$, where $N_{turbo}$ is the number of turbo decoding iterations, i.e., loop 326, and $N_{joint}$ is the number of iterations of loop 328. Further, the architecture described herein reduces the computational complexity of the receiver 300, particularly when compared with conventional receivers that exercise processing loops for a predetermined number of times regardless of the success of signal decoding.

It may be the case that hard decisions of bits based on intermediate soft decisions from the turbo decoder 314 have a number of errors. This may be true, for example, in a data structure where the same tone of seven contiguous OFDM symbols are grouped to form a dwell with the middle symbol being used as a reference and where each dwell may be assigned to a different mobile station. As is known in the art, a dwell can be a minimum data unit that is formed by one tone in the frequency dimension and seven OFDM symbol intervals in the time dimension. As such, a dwell can have six QAM symbols as payload, with each QAM symbol occupying one tone and one OFDM symbol interval, and one reference symbol in the middle. At the receiver, each dwell can be demodulated using channel estimation based on the reference symbol in the middle. This also may be true for low signal-to-noise-ratio operations. If so, the associated recovered QAM symbols likely contain many errors. It should be noted that the dwell structure example is only for illustrative purposes and does not limit the present invention. For example, one embodiment, uses the tile structure as discussed above.

In one embodiment, once all code bits are generated by the turbo decoder 314, only those with high decode confidence are used for data symbol recovering. This technique for QAM symbol recovery helps mitigate error propagation and, in one embodiment, is based upon ternary bits fed back from the turbo decoder 314. This bit selection, in one embodiment, is achieved by passing all soft decisions from the turbo decoder 314 (or LLR values) through a decision threshold module 316. In one embodiment, the bits with magnitude of soft decisions larger than the threshold are selected for data symbol recovering. In other words, the feedback bit sequence from modified turbo decoder can be expressed as $$b_k = \begin{cases} 1 & L(b_k) \geq T \\ -1 & L(b_k) < -T \\ 0 & \text{Otherwise} \end{cases}$$

In the rule above, $LLR(b_k)$ represents the soft decision of bit k, and T represents a preset threshold. Generally, only those detected bits with large confidence levels are used or accepted as accurate.

Figure 4:
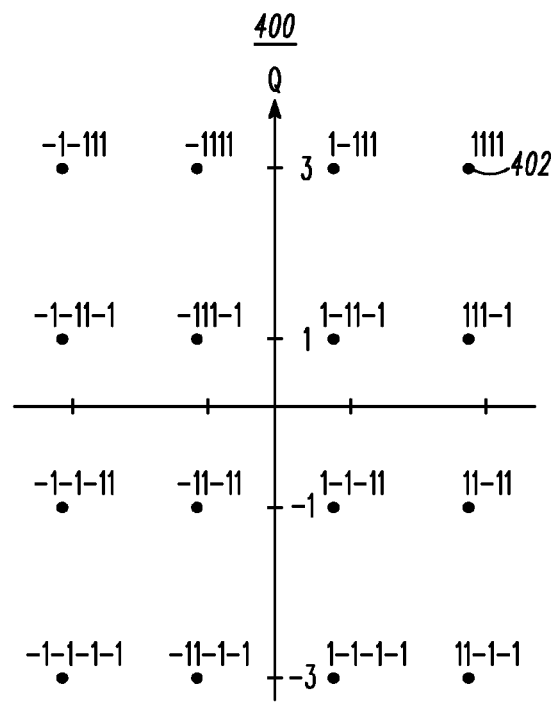
FIG. 4 to FIG. 7 are illustrative constellation diagrams according to an embodiment of the present invention.

Since the feedback sequence comprises ternary bits, M-QAM data symbols are recovered after the ternary bit stream is used to degenerate the constellation and the QAM symbol recovery module 320, finds the closest degenerated constellation point to the soft received symbol. A method is presented below for the ternary bit-to-QAM mapping. For simplicity and without loss of generality, a 16-QAM modulation with the constellation illustrated in FIG. 4 is used as an example for the method.

For purposes of illustration and simplicity, each 16 QAM symbol 402 corresponds to a 4-bit group and the bit-to-symbol mapping rule is $s_I=2b_0+b_1$ and $s_Q=2b_2+b_3$, where a 16 QAM symbol is defined as $s=s_I+js_Q$. If a 4-bit group formed by the ternary bits from the turbo decoder 314 does not contain zero, the associated 16 QAM symbol can be recovered by the QAM symbol recovery module 320 by the mapping rule. If, however, one or more of the bits are zero, for example, $b_k=1$ and $b_{k+1}=b_{k+2}=b_{k+3}=0$ for the kth 16 QAM symbol, the associated kth 16 QAM symbol can be recovered by module 320 by slicing the corresponding soft 16 QAM symbol, which is stored in the antenna weight calculation module 324 as a result from a previous pass, using the slicer defined by the constellation diagram 500 shown in FIG. 5. In general, a slicer determines the closest point in a constellation to an estimated point and is performed by the QAM recovery module 320.

Figure 5:
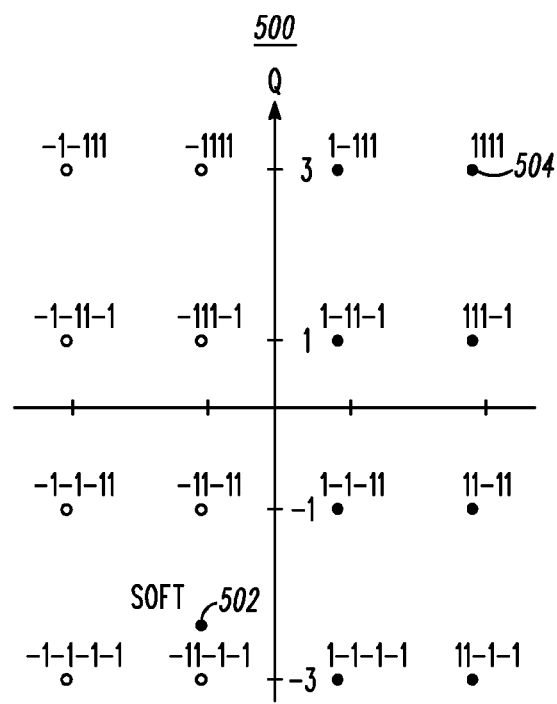
Figure 6:
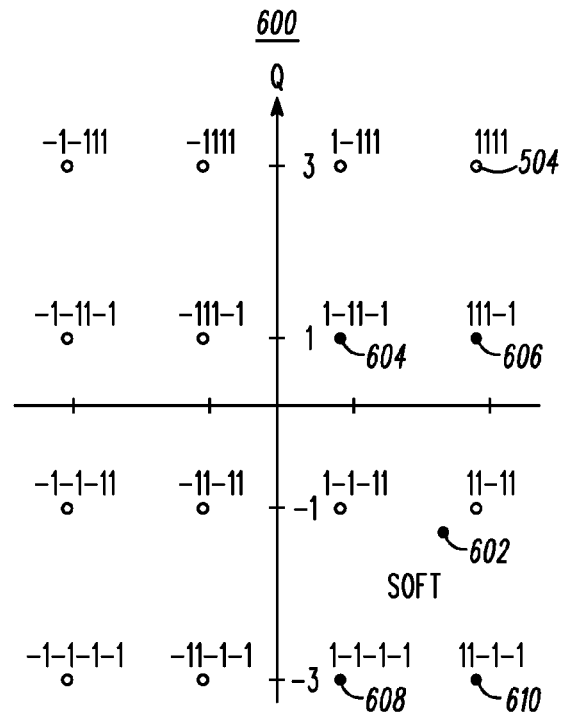
Figure 7:
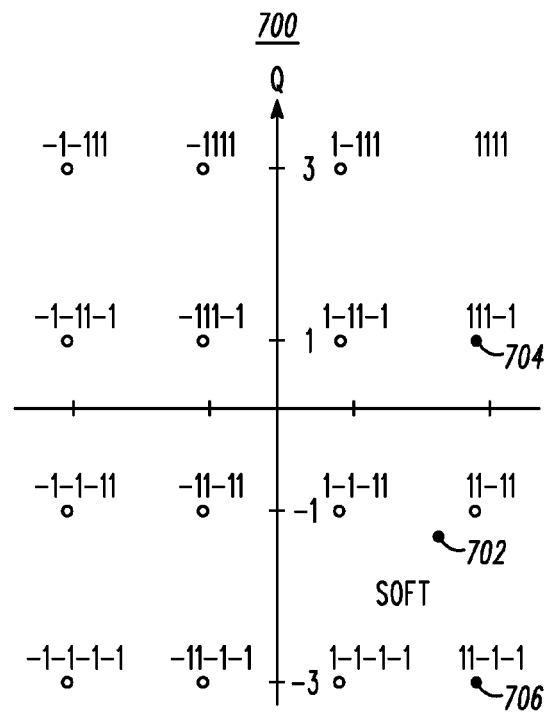

Recovered QAM symbols are limited to the degenerated constellation points 504, i.e. the points on the right hand side of FIG. 5. The recovered 16 QAM symbol, corresponding to the soft symbol 502, based on the turbo decoder 314 feedback is (1−j3) rather than (−1−j3) were a full 16 QAM slicer to be used. Furthermore, if $b_k=1$, $b_{k+3}=-1$, and $b_{k+1}=b_{k+2}=0$, the slicer would be defined by the constellation diagram 600 as shown in FIG. 6. The resulting hard 16 QAM would be (3−j3) instead of (3−j) for soft symbol 602 since slicing, of soft symbol 602 would be limited to constellation points 604, 606, 608, 610. If $b_k=1$, $b_{k+1}=1$, and $b_{k+3}=-1$, while $b_{k+2}=0$, the slicer would be defined by the constellation diagram 700 of FIG. 7. The recovered 16 QAM symbol would be (3−j3) instead of (1−j) for soft symbol 702 since interpretation of soft symbol 702 is then limited to constellation points 704, 706. This technique can be more beneficial when recovering QAM symbols of higher order QAM modulations such as 64 QAM and 256 QAM.

After all QAM symbols for data are recovered, the QAM symbols can be used in a second processing pass as reference symbols for channel estimation. In one arrangement, during a first demodulation pass, one-tap channel estimator coefficients can be determined by the channel estimator based on the reference symbol in the middle of the dwell. The coefficients can be used for all 6 data symbols in the same dwell during a second demodulation pass within the 328 loop.

The channel estimator 322 removes the amplitude and phase variations resulting from a fading environment. Equalization, in one embodiment, is performed every pass through the channel estimator 322. The whole loop 328 can be iterated as many times as needed to get increasingly better frames. The channel estimator coefficients can be calculated based on the reference symbol and applied to all 6 recovered data symbols. The averaged value is applied to all 6 data symbols during the second pass channel estimation.

This average can be a simple average, a mean, or a weighted mean. That is, the channel estimator coefficient for ith tone over a particular dwell can be expressed as $$C_i = \frac{1}{7} \sum_{k=1}^{7} \frac{s_{i,i}}{\tilde{s}_{i,k}} \text{ or } C_i = \frac{1}{\sum_k w_k} \sum_{k=1}^{7} w_k \frac{s_{i,i}}{\tilde{s}_{i,k}}.$$

Accordingly, $S_{i,k}$ and $\tilde{s}_{i,k}$ are QAM symbols and associated soft symbols in a given dwell respectively. The middle QAM symbol is the known reference and the remaining QAM symbols are recovered data symbols. $w_k$ is a weight applied to the associated estimate. The value of $w_k$ depends upon the ternary bit values for the associated QAM symbol. For example, in case of 16 QAM, $w_k$ may be 1, 0.75, 0.5, 0.25, and 0 corresponding to the feedback 4-bit group which has 0, 1, 2, 3, and 4 zeros.

As known, OFDM communication systems may suffer both FFT-leakage, in reference to interference among tones, and phase rotation, in the case of Doppler shift and frequency error. A one-tap channel estimator can compensate the phase error in an effort to mitigate the impact of frequency error. As such, the one tap-channel estimator coefficient can be phase adjusted over one dwell based on estimated frequency error or Doppler shift. This frequency error estimate can be performed based upon reference symbols and recovered QAM data symbols.

For example, if $\Delta\phi$ represents the relative phase difference of two adjacent QAM symbols along the same tone index, the frequency error estimate for one mobile station can be expressed as $$\Delta f = \frac{1}{2\pi M T_{OFDM}} \sum_{k=1}^{M} \Delta\varphi_k.$$

Here, M represents the total number of phase differences of a mobile station over multiple dwells and tones. The relative phase difference can be calculated along the same tone for different OFDM symbol indices. $T_{OFDM}$ represents one OFDM symbol time interval. In the estimate, all recovered data QAM symbols are used as "reference symbols." Also, the weighted average can be used for frequency error estimation in the same manner as described previously. The phase adjustment of the one tap equalizer coefficient for different data symbol positions in a given dwell then can be determined based upon $\Delta f$ and the relative position of the interested data symbol to the reference symbol. For example, $\Delta\Phi_k = (4-k) 2\pi T_{OFDM} \Delta f$, where k=1, 2, 3, 4, 5, 6, and 7. $\Phi$, in one embodiment, is the phase error for each of the 7 symbols of the dwell, based on a frequency error of $\Delta f$. Here, k denotes the data symbol position in a dwell.

With all methods described above, namely, all-bit decoding, ternary bit feedback and degenerated QAM constellation, the recovered data symbols are fairly reliable for the antenna combining weight calculation. Any reliable recovered data symbol will significantly reduce the chance that the two users completely interfere with each other within a tile. For example, in case of 16-QAM, a single data symbol used as pilot will reduce the probability of complete interference by 1/16, and two data symbols will reduce the probability by 1/256, and so on. Consequently, overall performance of SDMA is significantly improved.

Wireless Communication Device

Figure 8:
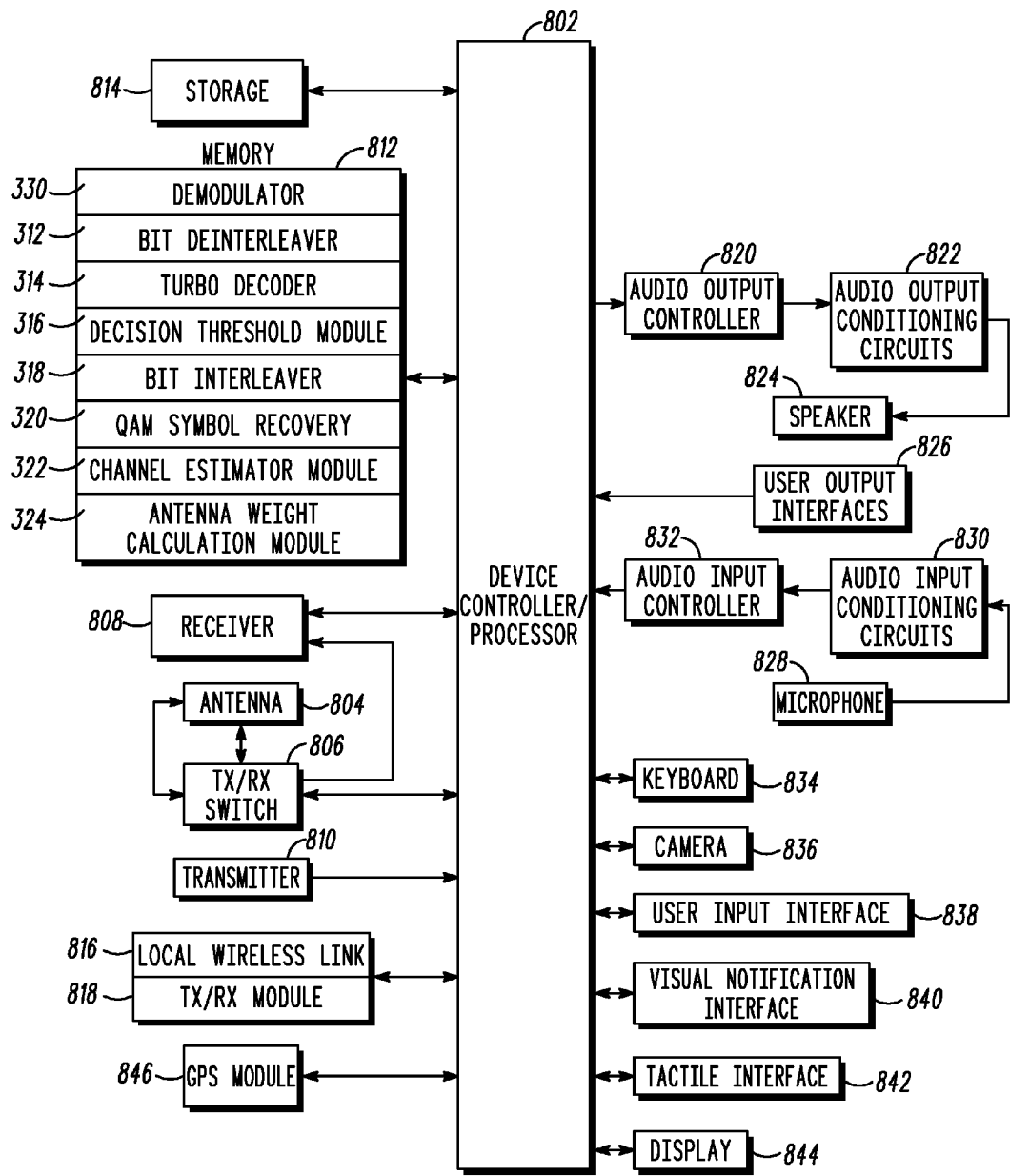
FIG. 8 is a block diagram illustrating a wireless communication device according to an embodiment of the present invention.

FIG. 8 is a block diagram illustrating a detailed view of the wireless communication device 204 according to an embodiment of the present invention. It should be noted that FIG. 8 illustrates only one example of a wireless communication device. Other wireless communication devices such as wireless communication air interface cards (not shown) are also compatible with the present invention and comprise many of the same components that are discussed below. In one embodiment, the wireless communication device 204 is capable of transmitting and receiving wireless information on the same frequency such as in an 802.16e system using TDD. The wireless communication device 204 operates under the control of a device controller/processor 802, that controls the sending and receiving of wireless communication signals. In receive mode, the device controller 802 electrically couples an antenna 804 through a transmit/receive switch 806 to a receiver 808. The receiver 808 decodes the received signals and provides those decoded signals to the device controller 802.

In transmit mode, the device controller 802 electrically couples the antenna 804, through the transmit/receive switch 806, to a transmitter 810. The device controller 802 operates the transmitter and receiver according to instructions stored in the memory 812. These instructions include, for example, a neighbor cell measurement-scheduling algorithm. The memory 812 also includes the demodulator 330, the bit de-interleaver 312, the all code bits turbo decoder 314, the decision threshold module 316, the bit interleaver 318, the QAM symbol recovery module 320, the channel estimation module 322, and the antenna weight calculation module 324. These components perform and interact as discussed above with respect to FIG. 3. Although shown as residing in the memory 812, one or more of these components can be implemented as hardware within the wireless communication device 204.

The wireless communication device 204, also includes non-volatile storage memory 814 for storing, for example, an application waiting to be executed (not shown) on the wireless communication device 204. The wireless communication device 204, in this example, also includes an optional local wireless link 816 that allows the wireless communication device 204 to directly communicate with another wireless device without using a wireless network (not shown). The optional local wireless link 816, for example, is provided by Bluetooth, Infrared Data Access (IrDA) technologies, or the like. The optional local wireless link 816 also includes a local wireless link transmit/receive module 818 that allows the wireless device 204 to directly communicate with another wireless communication device such as wireless communication devices communicatively coupled to personal computers, workstations, and the like.

The wireless communication device 204 of FIG. 8 further includes an audio output controller 820 that receives decoded audio output signals from the receiver 808 or the local wireless link transmit/receive module 818. The audio controller 820 sends the received decoded audio signals to the audio output conditioning circuits 822 that perform various conditioning functions. For example, the audio output conditioning circuits 822 may reduce noise or amplify the signal. A speaker 824 receives the conditioned audio signals and allows audio output for listening by a user. The audio output controller 820, audio output conditioning circuits 822, and the speaker 824 also allow for an audible alert to be generated notifying the user of a missed call, received messages, or the like. The wireless communication device 204 further includes additional user output interfaces 826, for example, a head phone jack (not shown) or a hands-free speaker (not shown).

The wireless communication device 204 also includes a microphone 828 for allowing a user to input audio signals into the wireless communication device 204. Sound waves are received by the microphone 828 and are converted into an electrical audio signal. Audio input conditioning circuits 830 receive the audio signal and perform various conditioning functions on the audio signal, for example, noise reduction. An audio input controller 832 receives the conditioned audio signal and sends a representation of the audio signal to the device controller 802.

The wireless communication device 204 also comprises a keyboard 834 for allowing a user to enter information into the wireless communication device 204. The wireless communication device 204 further comprises a camera 836 for allowing a user to capture still images or video images into memory 812. Furthermore, the wireless communication device 204 includes additional user input interfaces 838, for example, touch screen technology (not shown), a joystick (not shown), or a scroll wheel (not shown). In one embodiment, a peripheral interface (not shown) is also included for allowing the connection of a data cable to the wireless communication device 204. In one embodiment of the present invention, the connection of a data cable allows the wireless communication device 204 to be connected to a computer or a printer.

A visual notification (or indication) interface 840 is also included on the wireless communication device 204 for rendering a visual notification (or visual indication), for example, a sequence of colored lights on the display 844 or flashing one or more LEDs (not shown), to the user of the wireless communication device 204. For example, a received multimedia message may include a sequence of colored lights to be displayed to the user as part of the message. Alternatively, the visual notification interface 840 can be used as an alert by displaying a sequence of colored lights or a single flashing light on the display 844 or LEDs (not shown) when the wireless communication device 104 receives a message, or the user missed a call.

The wireless communication device 204 also includes a tactile interface 842 for delivering a vibrating media component, tactile alert, or the like. For example, a multimedia message received by the wireless communication device 204, may include a video media component that provides a vibration during playback of the multimedia message. The tactile interface 842, in one embodiment, is used during a silent mode of the wireless communication device 204 to alert the user of an incoming call or message, missed call, or the like. The tactile interface 842 allows this vibration to occur, for example, through a vibrating motor or the like.

The wireless communication device 204 also includes an optional Global Positioning System (GPS) module 846. The optional GPS module 846 determines the location and/or velocity information of the wireless communication device 204. This module 846 uses the GPS satellite system to determine the location and/or velocity of the wireless communication device 204. Alternative to the GPS module 846, the wireless communication device 204 may include alternative modules for determining the location and/or velocity of wireless communication device 204, for example, using cell tower triangulation and assisted GPS.

Information Processing System

Figure 9:
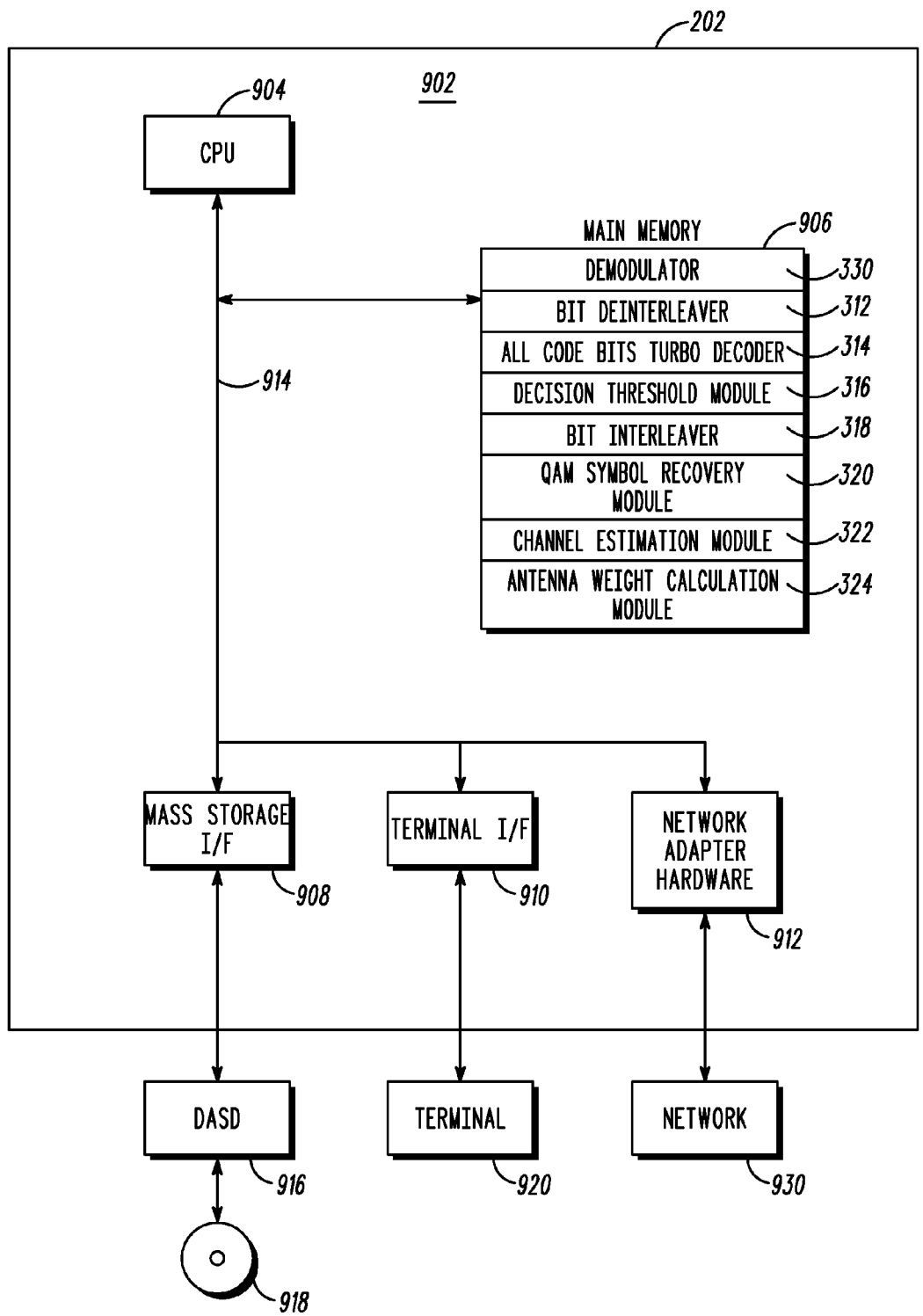
FIG. 9 is a block diagram illustrating an information processing system according to an embodiment of the present invention.

FIG. 9 is a block diagram illustrating a detailed view of site controller 220 according to an embodiment of the present invention. The site controller 220, in one embodiment, resides within its respective base station 216. In another embodiment, the site controller 220 resides outside of and is communicatively coupled to its respective base station 216, 218. The site controller 220, in one embodiment, is based upon a suitably configured processing system adapted to implement the exemplary embodiment of the present invention. Any suitably configured processing system is similarly able to be used as the site controller 220 by embodiments of the present invention, for example, a personal computer, workstation, or the like.

The site controller 220 includes a computer 902. The computer 902 has a processor 904 that is communicatively connected to a main memory 906 (e.g., volatile memory), non-volatile storage interface 908, a terminal interface 910, and a network adapter hardware 912. A system bus 914 interconnects these system components. The non-volatile storage interface 908 is used to connect mass storage devices, such as data storage device 916, to the gateway. One specific type of data storage device is a computer readable medium such as a CD drive, which may be used to store data to and read data from a CD or DVD 918 or floppy diskette (not shown). Another type of data storage device is a data storage device configured to support, for example, NTFS type file system operations.

The main memory 906, in one embodiment, includes the demodulator 330, the bit de-interleaver 312, the all code bits turbo decoder 314, the decision threshold module 316, the bit interleaver 318, the QAM symbol recovery module 320, the channel estimation module 322, and the antenna weight calculation module 324. These components perform and interact as discussed above with respect to FIG. 3. Although shown as residing in the memory 906, one or more of these components can be implemented as hardware within the site controller 220.

Although illustrated as concurrently resident in the main memory 906, it is clear that respective components of the main memory 906 are not required to be completely resident in the main memory 906 at all times or even at the same time. In one embodiment, the site controller 220 utilizes conventional virtual addressing mechanisms to allow programs to behave as if they have access to a large, single storage entity, referred to herein as a computer system memory, instead of access to multiple, smaller storage entities such as the main memory 906 and data storage device 916. Note that the term "computer system memory" is used herein to generically refer to the entire virtual memory of the site controller 220.

Although only one CPU 904 is illustrated for computer 902, computer systems with multiple CPUs can be used equally effectively. Embodiments of the present invention further incorporate interfaces that each includes separate, fully programmed microprocessors that are used to off-load processing from the CPU 904. Terminal interface 910 is used to directly connect one or more terminals 920 to computer 902 to provide a user interface to the computer 902. These terminals 920, which are able to be non-intelligent or fully programmable workstations, are used to allow system administrators and users to communicate with the site controller 220. The terminal 920 is also able to consist of user interface and peripheral devices that are connected to computer 902 and controlled by terminal interface hardware included in the terminal I/F 910 that includes video adapters and interfaces for keyboards, pointing devices, and the like.

An operating system (not shown), according to an embodiment, can be included in the main memory and is a suitable multitasking operating system such as the Linux, UNIX, Windows XP, and Windows Server 2001 operating system. Embodiments of the present invention are able to use any other suitable operating system, or kernel, or other suitable control software. Some embodiments of the present invention utilize architectures, such as an object oriented framework mechanism, that allows instructions of the components of operating system (not shown) to be executed on any processor located within the client. The network adapter hardware 912 is used to provide an interface to the network 202. Embodiments of the present invention are able to be adapted to work with any data communications connections including present day analog and/or digital techniques or via a future networking mechanism.

Although the exemplary embodiments of the present invention are described in the context of a fully functional computer system, those skilled in the art will appreciate that embodiments are capable of being distributed as a program product via floppy disk, e.g. floppy disk 9S18, CD ROM, or other form of recordable media, or via any type of electronic transmission mechanism.

Process of Suppressing Interference

Figure 10:
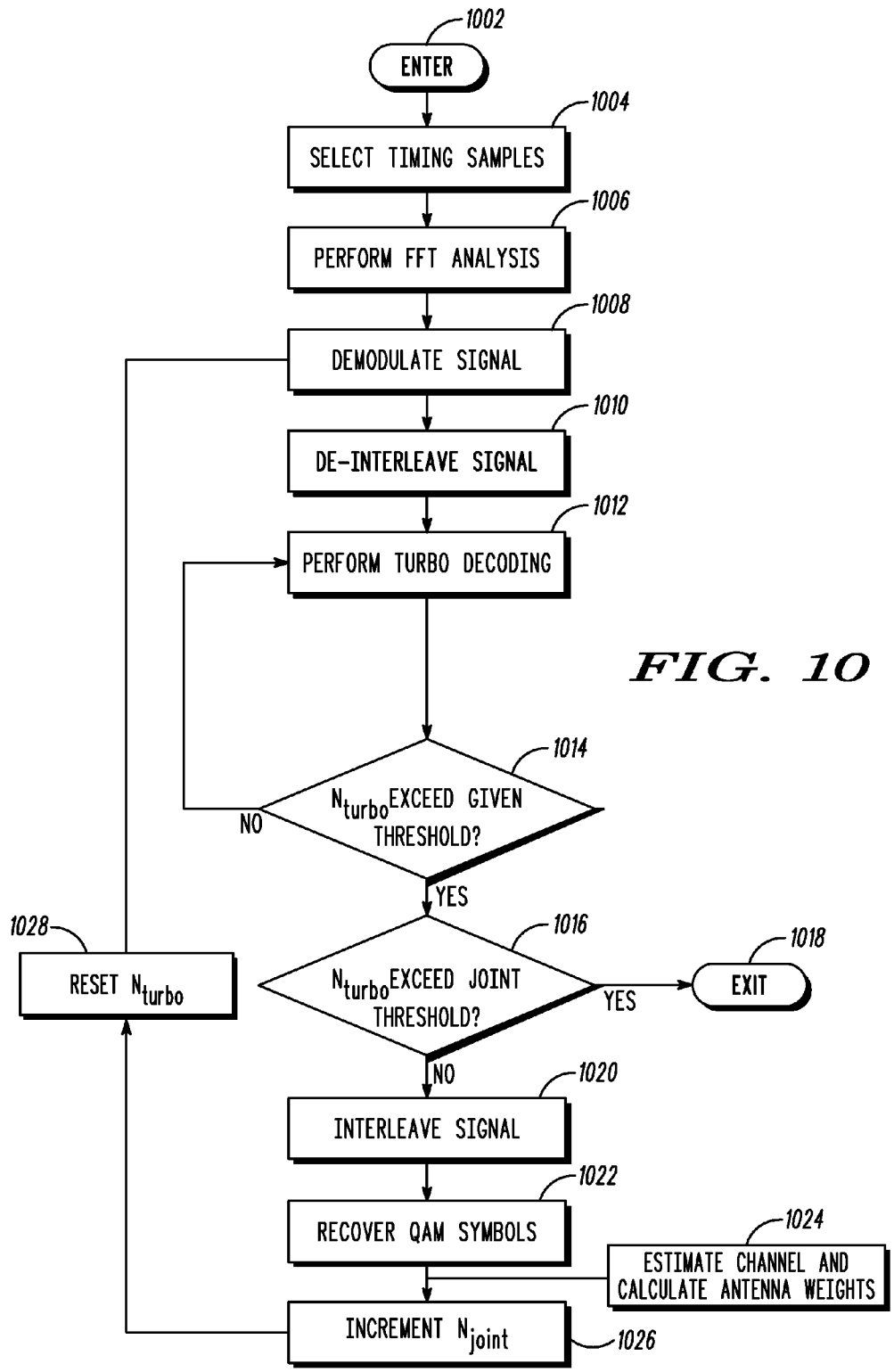
FIG. 10 is an operational flow diagram illustrating a process of suppressing interference in an Orthogonal Frequency Division Multiplexing communication system according to an embodiment of the present invention.

FIG. 10 is an operational diagram illustrating a process of suppressing interference in an OFDM communications system. In one embodiment, the process of FIG. 10 can be implemented using an OFDM receiver, for example, the receiver 300 discussed above with reference to FIG. 3. The process of FIG. 10 can begin in a state where a wireless signal has been received within the OFDM receiver and converted into a digital representation. Further, the counters within the OFDM receiver, to be discussed herein, can be initialized.

The operational flow diagram of FIG. 10 begins at step 1002 and flows directly to step 1004. At step 1004, one or more timing samples are selected for processing from the digitized signal. At step 1006, the signal is processed by performing an FFT analysis. At step 1008, the signal is then demodulated. At step 1010, the signal is then de-interleaved. At step 1012, a turbo decoding iteration is performed upon the signal. At step 1014, the receiver 300 determines if the $N_{turbo}$ exceeds a turbo threshold. If the result of the determination is negative, the control flows back to step 1012 to perform further turbo decoding iterations. It should be appreciated that in one aspect of the invention the threshold value can be determined according to, or defined as, the number of iterations in a given turbo decoding attempt. Thus, when the number of turbo decoding iterations constitute an attempt or a plurality of attempts fails, the control flow can proceed to step 1016.

If the result of the determination is positive, at step 1016, the receiver 300 determines whether the number of iterations of the joint demodulation-decoding loop, as monitored by counter $N_{joint}$, exceeds a second threshold. If the result of the determination is positive, the interference suppression process was unsuccessful and the control flow exits at step 1018. If the result of the determination is negative, at step 1020, the signal is be interleaved. At step 1022, QAM symbols are recovered from the signal. At step 1026, the receiver 300 performs channel estimation and calculates antenna weights. At step 1028, the value of counter $N_{joint}$ is incremented. Next, at step 1030, the counter $N_{turbo}$ is reset. The control flow then flows back to step 1008 to continue processing.

Process of Selecting a Whole Word Code Bit

Figure 11:
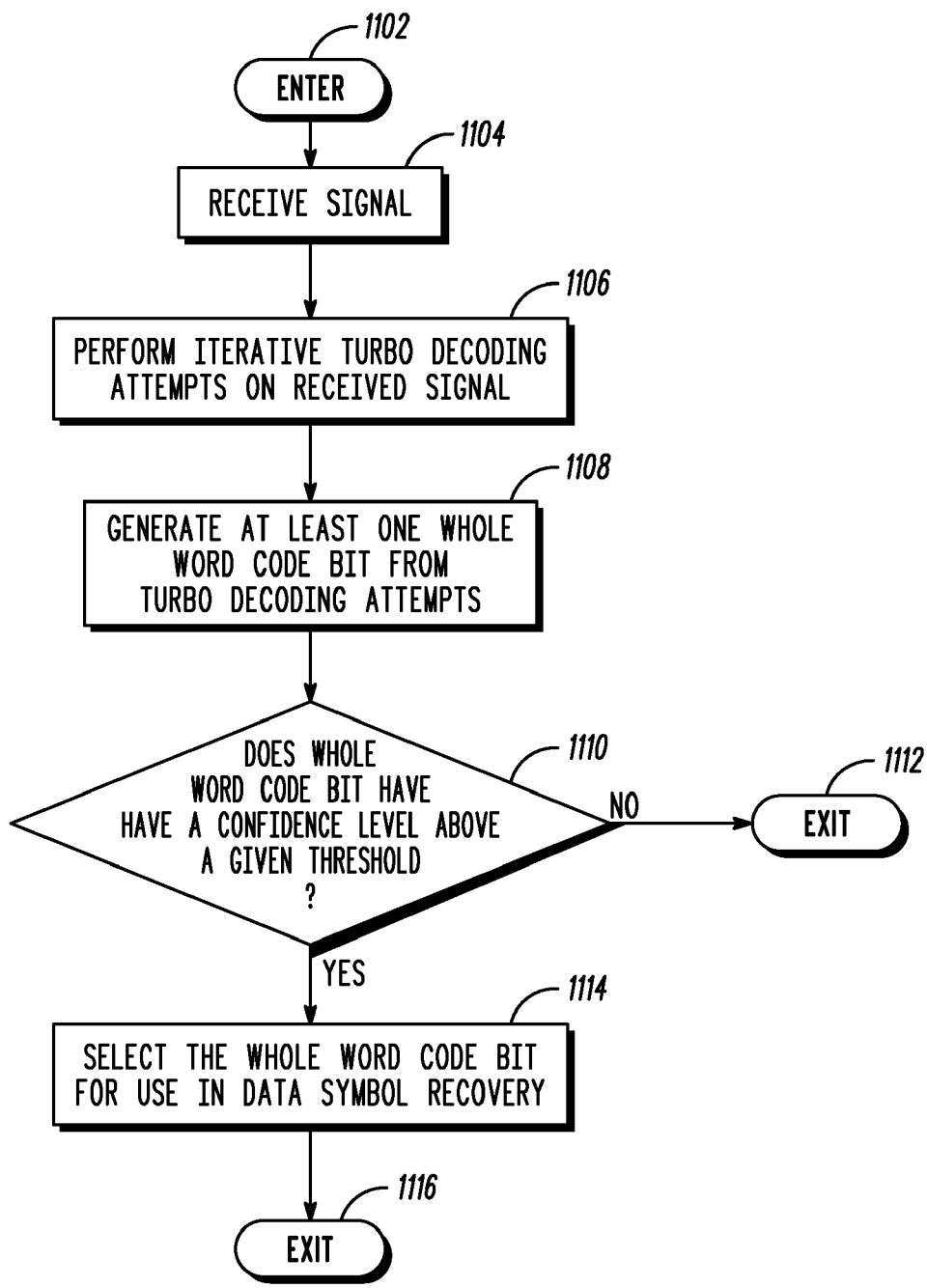
FIG. 11 is an operational flow diagram illustrating a process of selecting a whole word code bit for use in suppressing interference in an Orthogonal Frequency Division Multiplexing communication system according to an embodiment of the present invention.

FIG. 11 is an operational diagram illustrating a process of selecting a whole word code bit for suppressing interference in an OFDM communications system. In one embodiment, the process of FIG. 11 can be implemented using an OFDM receiver, for example, the receiver 300 discussed above with reference to FIG. 3. The operational flow diagram of FIG. 11 begins at step 1102 and flows directly to step 1104. At step 1104, the OFDM receiver 300 receives a signal. At step 1106, the turbo decoder 314 performs at least one turbo decoding attempt (or iterative turbo decoding attempts) on a received signal. At step 1108, at least one whole word code bit is generated from the turbo decoding attempts. In one embodiment, the whole word code bit corresponds to a group of bits comprising a transmitted symbol. At step 1110, the decision threshold module 316 determines if the whole word code bit has a confidence level exceeding a given threshold. If the result of this determination is negative, the control flow exits. If the result of this determination is positive, at step 1114, the whole word code bit is selected for use in data symbol recovery. The control flow then exits at step 1116.

Non-Limiting Examples

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method, of suppressing interference comprising:
    performing, with a turbo decoder, at least one turbo decoding attempt on a received signal so as to generate at least one whole word code bit therefrom, wherein the whole word code bit corresponds to a group of bits comprising a transmitted symbol;
    determining if the whole word code bit has a confidence level exceeding a given threshold; and
    if the confidence level exceeds the threshold, then performing the steps of:
        selecting the whole code word bit for use in data symbol recovery;
        recovering symbols associated with the received signal; and
        using the recovered symbols for channel estimation and antenna weight calculation;
    if the confidence level does not exceed the threshold, then bypassing the use of the whole code word bits for channel estimation and antenna weight calculation.

2. The method of claim 1, wherein the whole word code bit comprises one of a data bit and a parity check bit from a turbo decoder.

3. The method of claim 1, wherein selecting the whole word code bit further comprises:
    forming an interleaved signal by replacing the received signal whole word code bit before turbo decoding with the whole word code bit which has been selected from the turbo decoder; and
    recovering quadrature amplitude modulation (QAM) symbols from the interleaved signal.

4. The method of claim 1, further comprising:
counting turbo decoding attempts; and
processing the received signal through at least one joint demodulation-decoding loop based on the counting of turbo decoding attempts.

5. The method of claim 4, wherein the selecting of the signal further comprises:
comparing the turbo decoding attempt count with a threshold value; and
if the turbo decoding attempt count exceeds the threshold value,
processing the signal through the at least one joint demodulation-decoding loop.

6. The method of claim 5, wherein the processing of the signal further comprises:
processing the signal through the joint demodulation-decoding loop each time a predetermined number of turbo decoding attempts is performed.

7. The method of claim 4, wherein the processing further comprises:
receiving turbo decoder output as feedback within the joint demodulation-decoding loop; and
reducing a number of possible points in a QAM constellation according to the feedback.

8. The method of claim 7, wherein the performing of at least one turbo decoding attempt further comprises:
generating ternary bits having a value of one of $-1$, $0$, and $1$ according to a polarity and magnitude of a soft decision, wherein the feedback comprises, at least in part, the ternary bits.

9. The method of claim 8, further comprising:
reducing the number of possible points in a QAM constellation by half for each non-zero ternary bit.

10. The method of claim 1, further comprising:
determining channel estimates for symbol locations where at least one of a data bit and at least one parity bit had a high confidence value;
determining channel estimates for pilot symbol locations; and
computing at least one antenna weight based on at least one of:
a set of channel estimates associated with pilot symbols, data symbols, and
a combination of the set of channel estimates and the data symbols.

11. The method of claim 10, wherein the set of channel estimates is derived from ternary feedback bits from the turbo decoder.

12. A communication device comprising:
a memory;
a processor communicatively coupled to the memory;
an orthogonal frequency division multiplexing receiver communicatively coupled to the processor and memory; and
a turbo decoder communicatively coupled to the orthogonal frequency division multiplexing receiver, the turbo decoder configured to:
perform at least one turbo decoding attempt on a received signal so as to generate at least one whole word code bit therefrom, wherein the whole word code bit corresponds to a group of bits comprising a transmitted symbol;
determine if the whole word code bit has a confidence level exceeding a given threshold; and
if the confidence level exceeds the threshold, then:
select the whole code word bit for use in data symbol recovery;
recover symbols associated with the received signal; and
use the recovered symbols for channel estimation and antenna weight calculation;
if the confidence level does not exceed the threshold, then bypass the use of the whole code word bits for channel estimation and antenna weight calculation.

13. The communication device of claim 12, wherein the turbo decoder is further configured to:
form an interleaved signal by replacing the received signal whole word code bit before turbo decoding with the whole word code bit which has been selected from the turbo decoder; and
recover quadrature amplitude modulation (QAM) symbols from the interleaved signal.

14. The communication device of claim 12, wherein the whole word code bit comprises one of a data bit and a parity check bit from a turbo decoder.

15. The communication device of claim 12, wherein the turbo decoder is further configured to:
count turbo decoding attempts; and
process the received signal through at least one joint demodulation-decoding loop based on the counting of turbo decoding attempts.

16. The communication device of claim 15, wherein selecting of the signal further comprises:
comparing the turbo decoding attempt count with a threshold value;
if the turbo decoding attempt count exceeds the threshold value,
processing the signal through the at least one joint demodulation-decoding loop;
receiving turbo decoder output as feedback within the joint demodulation-decoding loop; and
reducing a number of possible points in a QAM constellation according to the feedback.

17. The communication device of claim 16, wherein processing the signal further comprises:
processing the signal through the joint demodulation-decoding loop each time a predetermined number of turbo decoding attempts is performed.

18. The communication device of claim 16, wherein the performing of at least one turbo decoding attempt further comprises:
generating ternary bits having a value of one of $-1$, $0$, and $1$ according to a polarity and magnitude of a soft decision, wherein the feedback comprises, at least in part, the ternary bits.

19. The communication device of claim 16, further comprising:
reducing the number of possible points in a QAM constellation by half for each non-zero ternary bit.

20. The communication device of claim 12, wherein the turbo decoder is further configured to:
determine a set of channel estimates for symbol locations where at least one of a data bit and at least one parity bit had a high confidence value;
determine channel estimates for pilot symbol locations; and computing at least one antenna weight based on at least one of:
a set of channel estimates associated with pilot symbols,
a set of channel estimates associated with data symbols, and
a combination of the set of channel estimates associated with pilot symbols and the set of channel estimates associated with data symbols and the set data symbols,
wherein the set of channel estimates associated with pilot symbols and the set of channel estimates associates with data symbols is derived from ternary feedback bits from the turbo decoder.

* * * * *